United States Patent
Brassington

[19]

[11] Patent Number: 5,859,448
[45] Date of Patent: Jan. 12, 1999

[54] ALTERNATIVE SILICON CHIP GEOMETRIES FOR INTEGRATED CIRCUITS

[75] Inventor: Michael P. Brassington, Sunnyvale, Calif.

[73] Assignee: Sun Microsystems, Inc., Palo Alto, Calif.

[21] Appl. No.: 921,856

[22] Filed: Sep. 2, 1997

Related U.S. Application Data

[63] Continuation of Ser. No. 670,488, Jun. 27, 1996, abandoned.

[51] Int. Cl.⁶ .................................................. H01L 27/10
[52] U.S. Cl. .................................... 257/203; 257/620
[58] Field of Search ................................. 257/203, 620

[56] References Cited

U.S. PATENT DOCUMENTS

| | | | |
|---|---|---|---|
| 4,789,889 | 12/1988 | Morris et al. | 257/203 |
| 5,300,796 | 4/1994 | Shintani | 257/203 |
| 5,341,024 | 8/1994 | Rostoker | 257/620 |
| 5,444,303 | 8/1995 | Greenwood et al. | 257/786 |

FOREIGN PATENT DOCUMENTS

| | | | |
|---|---|---|---|
| 63-107144 | 5/1988 | Japan | 257/203 |
| 4-014872 | 1/1992 | Japan | 257/203 |
| 4-162669 | 6/1992 | Japan | 257/203 |
| 8-162610 | 6/1996 | Japan | |

*Primary Examiner*—Jerome Jackson
*Assistant Examiner*—David B. Hardy
*Attorney, Agent, or Firm*—Beyer & Weaver, LLP

[57] ABSTRACT

A method for providing a triangularly shaped I/O region on the periphery of an integrated circuit in order to reduce the amount of unused surface area on the integrated circuit is disclosed. A core region within the triangularly shaped I/O region may be either triangularly shaped or rectangularly shaped, and may include one or more metallization lines routed in a direction parallel to at least one edge of the triangularly shaped I/O region on the periphery of the integrated circuit. Alternatively, the core region may include one or more metallization lines routed in a direction parallel to at least one edge of the triangularly shaped peripheral I/O region, as well as one or more other metallization lines routed in a direction perpendicular to at least one edge of the triangularly shaped peripheral I/O region. A plurality of I/O slots located in the triangularly shaped I/O region may be triangularly, trapezoidally, or rectangularly shaped.

4 Claims, 7 Drawing Sheets

ALTERNATIVE SILICON CHIP GEOMETRIES FOR INTEGRATED CIRCUITS

This is a continuation of application Ser. No. 08/670,488 filed Jun. 27, 1996, now abandoned.

BACKGROUND OF THE INVENTION

1. Field of Invention

The present invention relates to integrated circuit designs. More particularly the use of alternative silicon chip geometries is disclosed to increase the ratio of the number of I/O pads to the effective number of logic gates while reducing the amount of unused silicon on an integrated circuit.

2. Description of Prior Art

As integrated circuits have become more complex, the speed and number of logic gates required on an integrated circuit chip has increased. This increase in the required number of logic gates has prompted the development of technology which enables smaller logic gates to be fabricated. With a decrease in the size of logic gates used on an integrated circuit, however, comes an increase in the amount of unused silicon on the integrated circuit. Although decreasing the overall die size of the integrated circuit to reduce the amount of unused silicon is possible to a certain extent, the pitch of required peripheral I/O pads often makes it impossible to reduce the die size to eliminate unused silicon completely.

FIG. 1A is a diagrammatic top view of an integrated circuit chip die 110 with a core area 114, areas of unused silicon 116, and peripheral I/O pads 118. FIG. 1A is intended to show the locations of core area 114, areas of unused silicon 116, and peripheral I/O pad 118, and should be understood to be a generic, off-scale representation of integrated circuit die 110. Core area 114 is comprised of logic gates (not shown). A logic gate is typically comprised of six to eight transistors, although some logic gates (AND gates and inverters, for example) may require fewer transistors. Peripheral I/O pads 118, located along the perimeter of integrated circuit chip die 110, are bonded to an external frame (not shown) in a later part of the semiconductor fabrication process to create a complete packaged integrated circuit chip.

Advances in semiconductor technology have made it possible to reduce the amount of silicon necessary to fabricate logic gates used in integrated circuits. For an integrated circuit chip of a fixed size, the decrease in the size of logic gates makes it possible to increase the density of logic gates on the integrated circuit chip. FIG. 1B is a diagrammatic top view of an integrated circuit chip die 140 with a core area 144, a large area of unused silicon 146, and peripheral I/O pads 148. It should be understood that although the illustration of integrated circuit chip die 140 in FIG. 1B with the large area of unused silicon 146 and the high density of peripheral I/O pads 148 is an exaggerated representation of an actual integrated circuit chip die, large areas of unused silicon 146 have indeed become more prevalent in integrated circuit chip dies 140 due to the fact that the decrease in size of logic gates (not shown) housed in core area 144 has enabled the density of logic gates to increase.

As semiconductor technology scales to smaller feature dimensions for integrated circuit chips, the available logic gate density increases with the square of the scaling factor. With the increase in the density of logic gates comes an increase in the required number of peripheral I/O pads 148. However, the pitch of peripheral I/O pads 148 scales much more slowly than the density of logic gates, and is constrained by assembly considerations, as for example wire bonding technology tolerances. As a result, the size of a silicon die, as for example integrated circuit die 140, is often determined by the number of peripheral I/O pads 148 necessary in a design rather than the area of silicon required for the logic circuitry itself. Such silicon dies are described as being pad limited.

Since the size of peripheral I/O pads 148 is constrained by packaging technology and assembly constraints as described above, the size of peripheral I/O pads 148 may only be reduced to a certain point. Hence, the size of peripheral I/O pads 148 cannot be decreased in order to enable a higher number of peripheral I/O pads 148 to be placed. Typically, the overall size of integrated circuit chip die 140 is increased in order to allow for a higher number of peripheral I/O pads 148 to be implemented. While the overall size of integrated circuit chip die 140 is increased to accommodate a higher number of peripheral I/O pads 148, core area 144 does not increase in size. The area of unused silicon 146, however, increases with the size of integrated circuit chip die 140.

FIG. 1C is a diagrammatic top view of a portion of an integrated circuit chip die 180 with I/O pads 188, I/O slots 190, and areas of unused silicon 184. FIG. 1C is intended to further illustrate why the size of integrated circuit chip die 180 may not simply be decreased to reduce the areas of unused silicon 184. As discussed above with reference to FIG. 1B, the size of peripheral I/O pads 188 may only be decreased to a certain extent due to technology and assembly considerations. In addition, integrated circuit chip die 180 has I/O slots 190 between areas of unused silicon 184 and peripheral I/O pads 188. I/O slots 190 contain transistors (not shown) which serve as amplifiers, buffers, etc.; the transistors in I/O slots 190 are typically larger than transistors which comprise logic gates (not shown) in the core area of integrated circuit chip die 180. Thus, the need for I/O slots 190 further prevents the possibility of shrinking the overall package size of integrated circuit chip die 180.

The area of a silicon die is a primary factor in determining the cost of fabricating an integrated circuit. As such, efforts have been made to reduce the amount of unused silicon on a die. In other words, efforts have been made to increase the available number of I/O pads while simultaneously reducing the size of the associated silicon die. One method which is used to increase the available number of I/O pads while reducing overall die size involves the use of a pad area array instead of the common peripheral ring of I/O pads. In this method, I/O pads are distributed across the area of a die rather than being confined to the periphery of the die. Although the use of a pad area array does reduce the amount of unused silicon on a die while allowing for more I/O pads to be incorporated into the die, implementing a pad area array requires significant modifications to the processes of fabricating and assembling integrated circuits. Any cost savings which may be gained from reducing the amount of silicon required on a die are most likely lost in the fabrication process.

The development of a method which reduces the amount of unused silicon on a die or a wafer, without significantly altering existing integrated circuit fabrication and assembly techniques, would reduce the overall cost associated with the semiconductor fabrication process.

SUMMARY OF THE INVENTION

In accordance with the present invention, I/O regions are provided on the periphery of a triangularly shaped integrated circuit in order to reduce the amount of unused surface area on the integrated circuit. Since the perimeter to surface area ratio of a triangular integrated circuit die is larger than the perimeter to surface area ratio of a triangular integrated circuit die of equal area, the use of a triangularly shaped integrated circuit die enables a higher number of I/O pads to be placed along its periphery than would be afforded by the rectangularly shaped integrated circuit die. Increasing the number of I/O pads for a given surface area of an integrated circuit die reduces the amount of unused silicon on a pad limited integrated circuit.

In some preferred embodiments, the silicon die may be shaped as an equilateral triangle. A core region within the peripheral I/O region may be similarly of a triangular (non-orthogonal) shape or a rectangular (orthogonal) shape. One or more layers of metal interconnect within the die may be configured on either a triangular (non-orthogonal) or rectangular (orthogonal) grid in order to connect logic gates to logic gates and logic gates to I/O cells.

In some preferred embodiments, the triangularly shaped I/O region may be shaped as an equilateral triangle. A core region within the triangularly shaped I/O region may be triangularly shaped, rectangularly shaped, etc., and may include one or more metallization lines routed in a direction parallel to at least one edge of the triangularly shaped I/O region on the periphery of the integrated circuit. Alternatively, the core region may include one or more metallization lines routed in a direction parallel to at least one edge of the triangularly shaped peripheral I/O region, as well as one or more other metallization lines routed in a direction perpendicular to at least one edge of the triangularly shaped peripheral I/O region.

In some preferred embodiments, a plurality of I/O slots located in the triangularly shaped I/O region may be triangularly or trapezoidally shaped. In others, the plurality of I/O slots may be rectangularly shaped. Non-rectangular I/O slots may allow more efficient use of silicon, as transistor width generally increases along the length of any given slot.

Preferably, the triangular integrated circuits of this invention are designed with the aid of integrated circuit design software implemented on a digital computer. A design method in accordance with this invention may include the following steps: (1) providing a triangularly shaped I/O region on the periphery of an the integrated circuit, and (2) providing a core region within the triangularly shaped I/O region. This method applies to forming both triangularly shaped integrated circuits with triangularly shaped core regions and triangularly shaped integrated circuits with rectangularly shaped core regions.

These and other features and advantages of the present invention will be presented in more detail in the following detailed description of the invention and in the associated figures.

DETAILED DESCRIPTION OF THE INVENTION

Figure 1A:
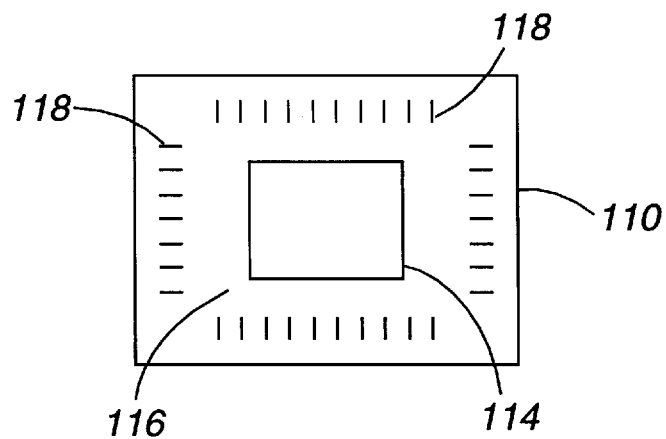
FIGS. 1A, 1B, and 1C are diagrammatic top views of an integrated circuit die illustrating a core area and I/O pads.
Figure 1B:
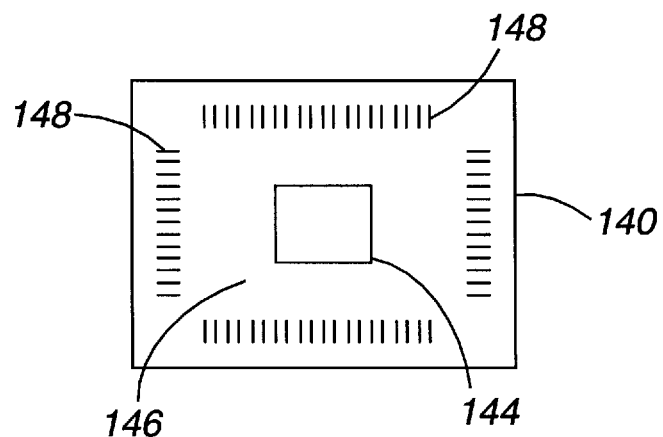
Figure 1C:
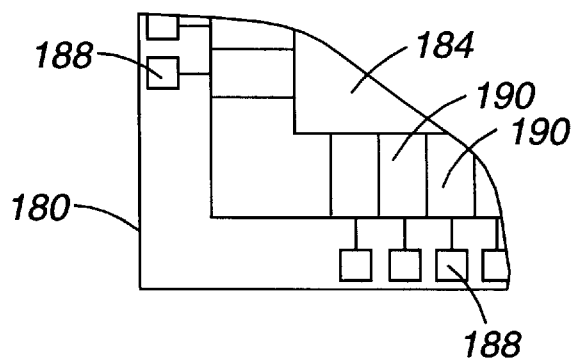
Figure 2A:
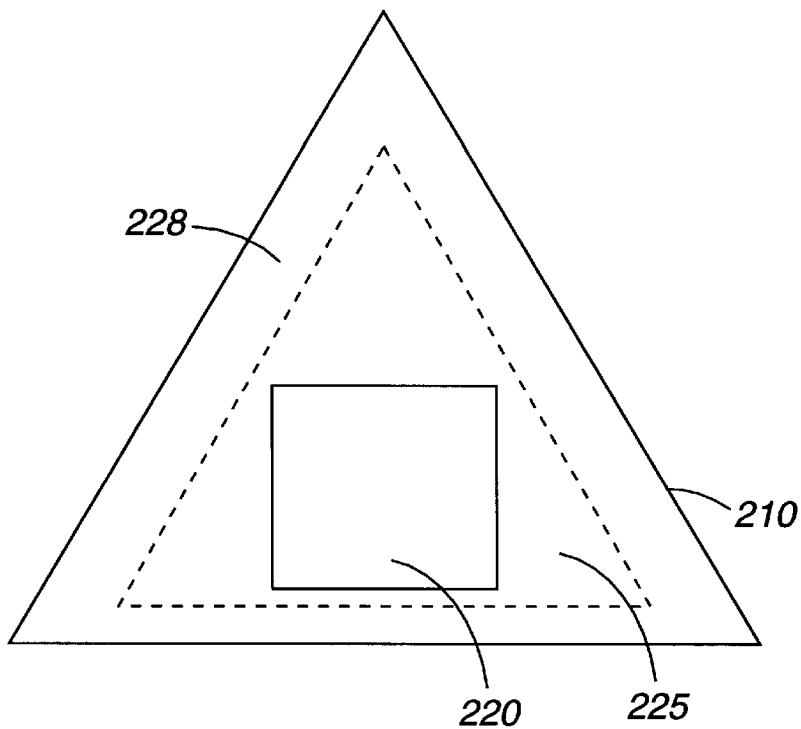
FIG. 2A is a diagrammatic illustration of a triangularly shaped integrated circuit die with a rectangularly shaped core area in accordance with a preferred embodiment of the present invention.

The present invention will now be described in detail with reference to a few preferred embodiments thereof as illustrated in the accompanying drawings. Referring initially to FIG. 2A, there is shown a triangularly shaped integrated circuit die 210, or other semiconductor die, in accordance with a preferred embodiment of the present invention. A rectangularly shaped core area 220 is contained within triangularly shaped integrated circuit die 210. It should be understood that the illustration as shown in FIG. 2A is a primitive representation of integrated circuit die 210, and is intended only to show the relative shapes of core area 220 and integrated circuit die 210. In this embodiment, triangularly shaped integrated circuit die 210 has the preferred shape of an equilateral triangle, although in other embodiments, triangularly shaped integrated circuit die 210 may have the shape of any one of a number of triangles, as for example a scalene triangle or a right triangle.

Integrated circuit die 210, with its triangular shape, generally has a greater ratio of perimeter length to surface area than a rectangularly shaped integrated circuit die with the same surface area. Although there are some cases in which rectangularly shaped integrated circuit dies have better ratios of perimeter length to surface area than comparably sized equilateral triangularly shaped integrated circuit dies with the same surface area, such rectangular dies must typically have one dimension which is considerably longer than a second dimension, i.e. the rectangularly shaped integrated circuit dies would have to be elongated and narrow. Problems associated with elongated rectangularly shaped integrated circuit dies may include difficulties with placing logic gates so that they are accessible to I/O slots and difficulties with routing metallization lines. For integrated circuits with the same area and similar surface dimensions, the perimeter length of triangularly shaped integrated circuit dies will be longer than the perimeter length of rectangularly shaped integrated circuit dies. Hence, triangularly shaped integrated circuit dies, as for example triangularly shaped integrated circuit die 210, have a better ratio of perimeter length to surface area than comparably sized rectangularly shaped integrated circuit dies.

Rectangularly shaped core area 220 contains logic gates and/or memory required by triangularly shaped integrated circuit die 210. A triangularly shaped I/O region 228, which contains I/O slots (not shown) and bonding pads (not shown), is located along the periphery of triangularly shaped integrated circuit die 210. Areas of unused silicon 225, also referred to as unused surface area, are located in regions between rectangularly shaped core area 220 and triangularly shaped I/O region 228.

Areas of unused silicon 225, i.e. the unused silicon on triangularly shaped integrated circuit die 210 with rectangularly shaped core area 220, are smaller than the areas of unused silicon on a rectangularly shaped integrated circuit die with a comparable core area and a comparable perimeter length. However, the actual surface area of the core area contained within a triangularly shaped integrated circuit die may be further increased with the use of a triangularly shaped core area, thereby reducing the amount of unused silicon on the integrated circuit die.

Figure 2B:
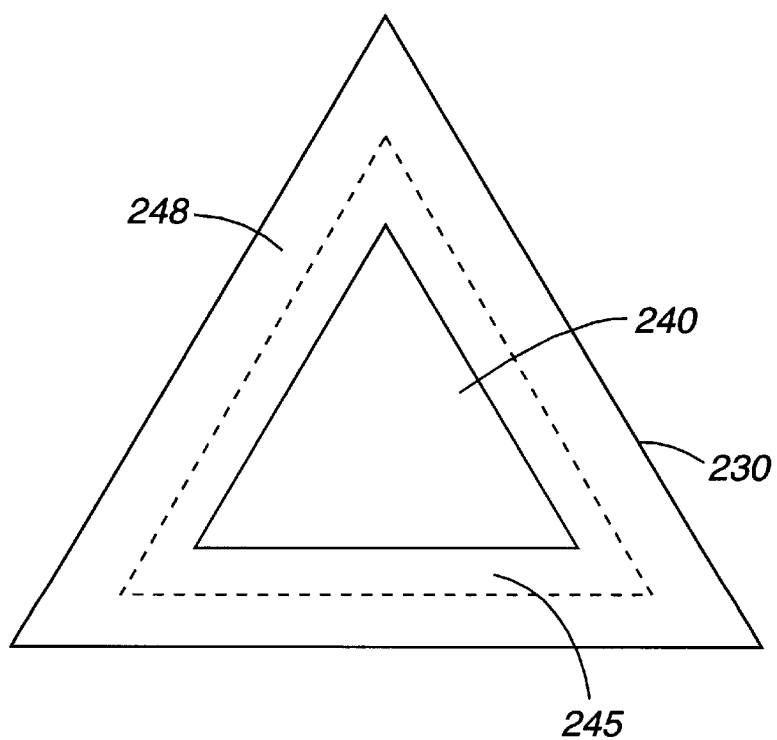
FIG. 2B is a diagrammatic illustration of a triangularly shaped integrated circuit die with a triangularly shaped core area in accordance with a preferred embodiment of the present invention.

Referring next to FIG. 2B, there is shown a triangularly shaped integrated circuit die 230 with a triangularly shaped core area 240 in accordance with a preferred embodiment of the present invention. A triangularly shaped I/O region 248 is located along the perimeter of triangularly shaped integrated circuit die 210, and areas of unused silicon 245 are located in regions between triangularly shaped I/O region 248 and triangularly shaped core area 240. As was the case with FIG. 2A, it should be understood that the illustration as shown in FIG. 2B is a primitive representation of integrated circuit die 230, and is intended only to show the relative shapes of core area 240 and integrated circuit die 230. In this embodiment, triangularly shaped integrated circuit die 230 and core area 240 each have the preferred shape of an equilateral triangle, although in other embodiments, triangularly shaped integrated circuit die 230 and core area 240 may have the shape of any one of a number of triangles, as for example a right triangle. Triangularly shaped integrated circuit die 230 and core area 240 are not constrained to having the same triangular shape. By way of example, triangularly shaped integrated circuit die 230 may have the shape of an equilateral triangle while core area 240 may have the shape of a right triangle.

The fabrication of triangularly shaped integrated circuit dies, and therefore, the fabrication of triangularly shaped integrated circuits, does not require that significant changes be made to the conventional fabrication process used to produce rectangularly shaped integrated circuits. By way of example, the manner in which metallization lines are routed on a triangularly shaped integrated circuit die is largely the same as the manner in which metallization lines are routed on rectangularly shaped integrated circuit dies. As will be explained in more detail below, the routing of metallization lines on a triangularly shaped integrated circuit die may be conducted such that at least some metallization lines are routed along paths which are parallel to at least one side of the triangularly shaped I/O region of the triangularly shaped integrated circuit die. Similarly, additional metallization lines on a triangularly shaped integrated circuit die may be routed along paths which are perpendicular to at least one side of the triangularly shaped I/O region of the triangularly shaped integrated circuit die. In some cases, this may provide the most direct access from a core circuit to the appropriate I/O slot.

Figure 3:
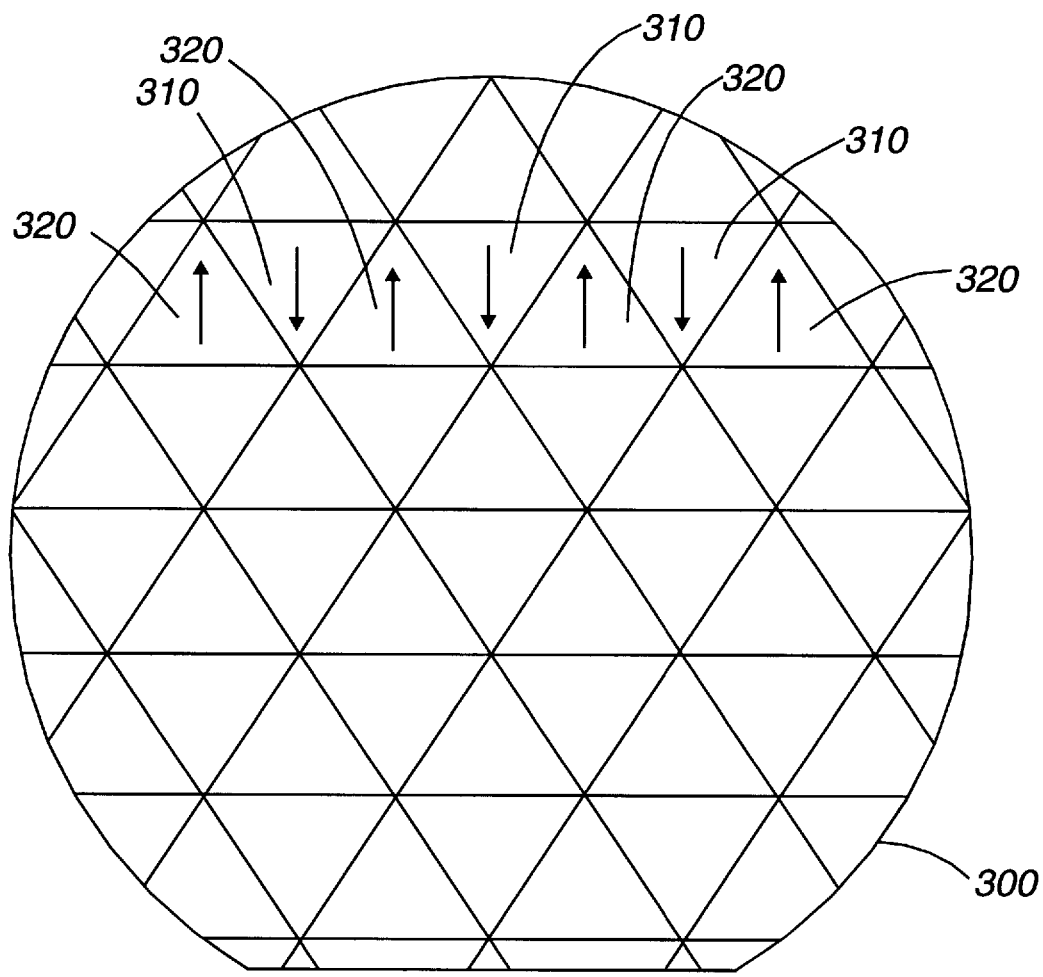
FIG. 3 is a diagrammatic top view of a semiconductor wafer illustrating triangularly shaped integrated circuits in accordance with a preferred embodiment of the present invention.

Referring next to FIG. 3, there is shown a diagrammatic top view of the surface of a semiconductor wafer 300 illustrating the partitioning required in order to produce individual, triangularly shaped integrated circuits 310 and 320. Semiconductor wafer 300 is divided into groups of triangularly shaped integrated circuits 310 and 320. In the embodiment as shown, triangularly shaped integrated circuits 310 and 320 are shaped as equilateral triangles. However, it should be understood that triangularly shaped integrated circuits 310 and 320 may instead be shaped as other types of triangles, as for example scalene triangles.

There are two orientations for triangularly shaped integrated circuits 310 and 320; a first orientation of triangularly shaped integrated circuits may be referred to as downwardly-oriented triangularly shaped integrated circuits 310, and a second orientation may be referred to as upwardly-oriented triangularly shaped integrated circuits 320. The second orientation is simply the first orientation rotated by 180 degrees. As previously mentioned, triangularly shaped integrated circuits 310 and 320 may be formed with only slight modifications to the overall conventional semiconductor fabrication process used to form rectangularly shaped integrated circuits. One such modification involves the manner in which semiconductor wafer 300 is sawed to produce triangularly shaped integrated circuits 320. Conventionally, saw traverses are made in two orthogonal directions to form rectangularly shaped integrated circuits. To produce triangularly shaped integrated circuits 310 and 320 which are shaped as equilateral triangles, saw traverses are made in three directions, i.e. saw traverses in three directions are made at 60 degree angles with respect to each other.

The size of integrated circuit dies may be such that reticles used in the lithography process contain only lines associated with a single integrated circuit. Typically, reticles have lengths and widths of approximately 20 millimeters, whereas conventional integrated circuit dies have lengths and widths in the range of approximately 10 millimeters to 17 millimeters. In the event that only lines associated with one triangularly shaped integrated circuit 310 or 320 may be placed on a single reticle, the reticle must be stepped across semiconductor wafer 300 in two orientations. In other words, the reticle may be first stepped across semiconductor 300 in a downward orientation to produce downwardly-oriented triangularly shaped integrated circuits 310, then the reticle (or the wafer) is rotated 180 degrees and stepped across semiconductor 300 in an upward orientation to produce upwardly-oriented triangularly shaped integrated circuits 320. It should be obvious that the reticle may first be stepped across semiconductor wafer 300 in the upward orientation prior to the downward orientation. In some cases, it may be desirable to utilize two reticles, where one reticle is simply the other reticle rotated by 180 degrees.

If the size of triangularly shaped integrated circuits 310 and 320 is such that at least one triangularly shaped integrated circuit 310 and 320 of each orientation may fit on the reticle used in a lithography process (i.e., the reticle pattern defines the layout of at least two integrated circuits), the reticle may be stepped across semiconductor wafer 300 without being rotated. The ability to step the reticle across semiconductor wafer 300 in a single pass would save time in the overall semiconductor fabrication process.

The use of triangularly shaped integrated circuits 310 and 320, in addition to reducing the amount of unused silicon on integrated circuits 310 and 320, further reduces the overall amount of unused silicon on semiconductor wafer 300 as well. Triangularly shaped integrated circuits 310 and 320 may be packed more tightly along the perimeter of semiconductor wafer 300 than traditional rectangularly shaped integrated circuits. Hence, the tighter packing results in less unused silicon along the perimeter of semiconductor wafer 300, further reducing the overall amount of wasted silicon in the semiconductor fabrication process.

Figure 4A:
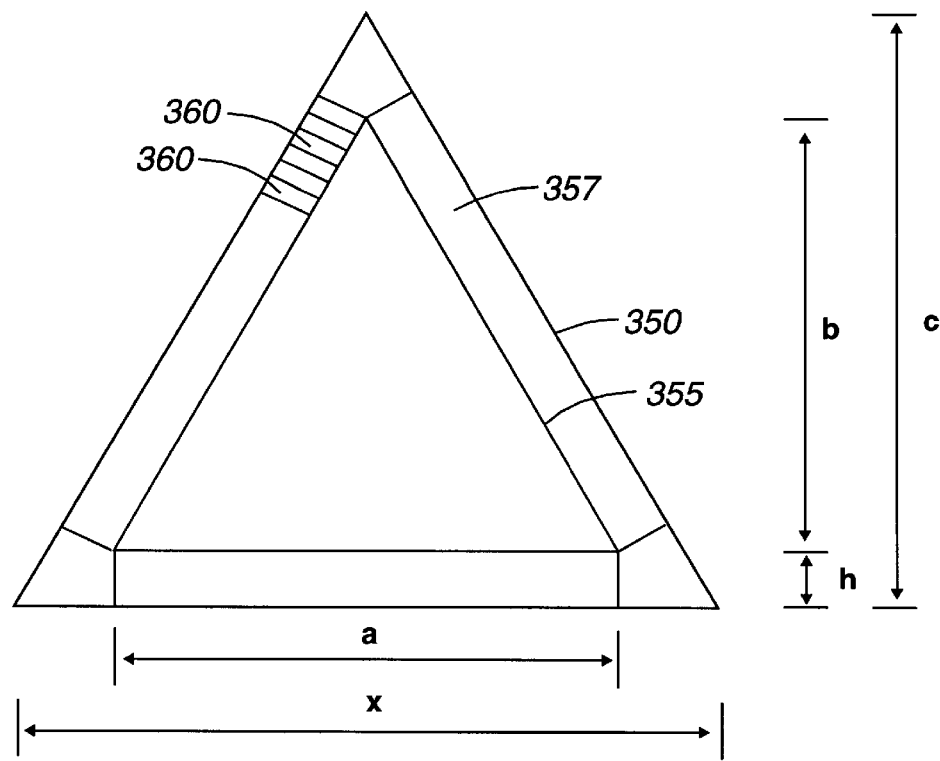
FIG. 4A is a diagrammatic top view of an equilateral integrated circuit presented for comparison with a square integrated circuit.

FIG. 4A is a diagrammatic top view of an equilateral triangle integrated circuit 350 with a triangularly shaped core area 355. The purpose of FIG. 4A is to show the relationship between perimeter length (which corresponds to the number of available I/O pads) and surface area for equilateral triangle integrated circuit 350; hence, it should be understood that triangularly shaped core area 355 as shown represents the maximum area which any triangularly shaped core area may cover. In other words, the area covered by triangularly shaped core area 355 of equilateral triangle integrated circuit 350 may, in typical cases, represent both a core area and any areas of unused silicon. Each side of equilateral triangle integrated circuit 350 has a length designated by variable x, and each side of triangularly shaped core area 355 has a length designated by variable a. The overall distance from one side of equilateral triangle integrated circuit 350 to the vertex directly opposite from the side is designated as dimension c. Similarly, the distance from one side of triangularly shaped core area 355 to an opposite vertex of core area 350 is designated as dimension b. The area between the periphery of equilateral triangle integrated circuit 350 and the periphery of triangularly shaped core area 355, which contains I/O slots 360, is known as a peripheral I/O area 357. The width of peripheral I/O area 357 is designated as dimension h. It should be understood that I/O slots 360 are present on all sides of equilateral triangle integrated circuit 350. However, for ease of illustration, only a few I/O slots 360 have been shown.

The pitch of I/O slots 360, i.e. the width of each I/O slots 360, is designated as L, and the number of I/O pads 360 which may fit along the periphery of equilateral triangle integrated circuit 350 is designated as p. Hence, it follows that side length a of triangularly shaped core area 355 may be calculated by the following relationship:

$$a = \frac{p}{3} * L$$

Using simple trigonometric relationships, with each angle of triangularly shaped core area 355 equal to 60 degrees, i.e. core area 355 is an equilateral triangle, dimension b is calculated as:

$$b = \frac{a}{2} * \tan(60 \text{ deg})$$

Triangularly shaped core area 355 has a surface area T(core area) which may then be determined from the following relationship:

$$T(\text{core area}) = \frac{a}{b} * b$$

Reducing the relationship set forth above by substituting in the appropriate expression for dimension b results in the following simplified expression for the surface area T(core area) of triangularly shaped core area 355:

$$T(\text{core area}) = 0.43 * a^2$$

Similarly, the "height," or dimension c, of equilateral triangle integrated circuit 350 is determined from the following relationship:

$$c = \frac{x}{2} * \tan(60 \text{ deg})$$

The surface area T(die area) of equilateral triangle integrated circuit 350 is expressed as follows:

$$T(\text{die area}) = \frac{x}{2} * c$$

Simplifying the above described relationship gives:

$$T(\text{die area}) = 0.43 * x^2$$

As is well known to those skilled in the art, peripheral I/O pads typically may not be placed at or near the corners of conventional rectangularly shaped integrated circuits. Similarly, I/O slots 360 on the periphery of an equilateral triangle integrated circuit (e.g. equilateral triangle integrated circuit 350) may not be placed in close proximity to the corners of the integrated circuit. Therefore, the actual portion of the total perimeter length of equilateral triangle integrated circuit 350 which will contain I/O slots 360 is approximately equal to the perimeter length of triangularly shaped core area 355, which may be expressed as 3* a.

Arithmetic manipulation, together with the use of well known methods such as the law of similar triangles, allows an expression for side length a to be derived in terms of side length x and peripheral area width h. Side length a may therefore be expressed as:

$$a = x - 2 * \left( \frac{h}{\tan(30 \text{ deg})} \right)$$

Simplifying the above expression gives:

$$a = x - 3.46 * h$$

Substituting the previous expression into the expression for side length a in terms of pitch L and the number of I/O pads p as described above results in the following expression for the number of I/O pads p:

$$p = \frac{3 * (x - 3.46 * h)}{L}$$

It should be clear that values for side length x and the width h of peripheral I/O area 357 must be selected such that the number of I/O pads p is both non-zero and non-negative.

Finally, taking a ratio of the number of I/O pads p to the overall surface area T(die area) for triangular integrated circuit 350 gives:

$$\frac{p}{T(\text{die area})} = \frac{6.98 * (x - 3.46 * h)}{x^2 * L}$$

Figure 4B:
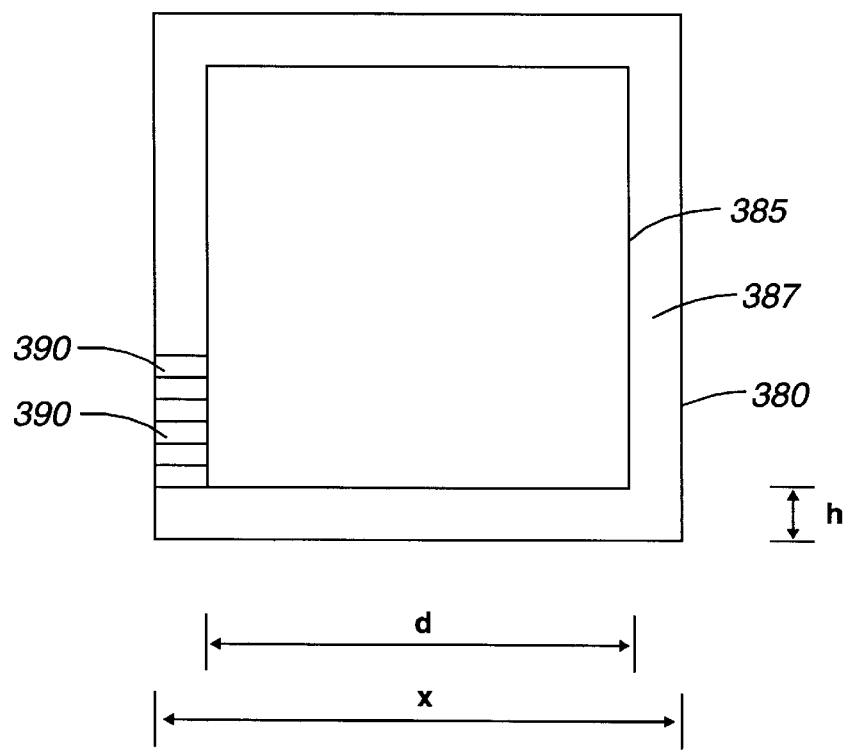
FIG. 4B is a diagrammatic top view of a square integrated circuit presented for comparison with the equilateral triangle integrated circuit of FIG. 4A.

FIG. 4B is a diagrammatic top view of a square integrated circuit 380 with a 20 square core area 385. As was the case for FIG. 4A, the purpose of FIG. 4B is to show the relationship between perimeter length and surface area for square integrated circuit 385. Therefore, it should be understood that square core area 385 as shown represents the maximum surface area which any square core area may cover. In other words, the surface area covered by square core area 385 of square integrated circuit 380 may house both a square core area and areas of unused silicon. Each side of square integrated circuit 380 has a length designated by variable x, and each side of square core area 355 has a length designated by variable d. For the purpose of comparing the integrated circuits of FIGS. 4A and 4B, side length x in both figures should be assumed to be the same in both figures. The area between the periphery of square integrated circuit 380 and square core area 385, which contains I/O slots 390, is known as a peripheral I/O area 387. Although I/O slots 390 are present along all sides of square integrated circuit 380, for ease of illustration, only a few have been shown. The width of peripheral I/O area 387 is designated as dimension h. As was the case for side length x, dimension h should be assumed to be the same in FIGS. 4A and 4B.

The pitch of I/O slots 390, i.e. the width of each I/O pad 390, is designated as L. Pitch L should be assumed to be the same in FIGS. 4A and 4B. The number of I/O pads 390 which may fit along the periphery of square integrated circuit 380 is designated as q. It follows that side length d of square core area 385 may be expressed in terms of pitch L and the number of I/O pads q as follows:

$$d = \frac{q}{4} * L$$

In terms of side length x and the width of peripheral I/O area 387, side length d may also be expressed as:

$$d = x - 2*h$$

The total number of peripheral I/O pads q may be determined by manipulating previously described expressions for side length d to arrive at the following relationship:

$$q = \frac{4 * (x - 2 * h)}{L}$$

Square integrated circuit 380 has a surface area S(die area) which may be expressed as follows:

$$S(\text{die area}) = x^2$$

Square core area 385 has a surface area S(core area) which may then be determined from the following relationship:

$$S(\text{core area}) = d^2$$

Reducing the relationship for surface area S(core area) by substituting in the expression for dimension d as described above results in the following simplified expression for the surface area of square core area 385:

$$S(\text{core area}) = (x - 2 * h)^2$$

Taking a ratio of the number of peripheral I/O pads q to the overall surface area S(die area) for square integrated circuit 380 gives:

$$\frac{q}{S(\text{die area})} = \frac{4 * (x - 2 * h)}{x^2 * L}$$

It should be clear that values for side length x and peripheral I/O area width h must be chosen such that the number of I/O pads q is well-defined, i.e. greater than or equal to one.

The ratio of the number of peripheral I/O pads q to the overall surface area S(die area) for square integrated circuit 380 is lower than the equivalent ratio as described above with respect the equilateral triangle integrated circuit of FIG. 4A. Hence, for a given required core area, i.e. a required number of logic gates, the use of an equilateral triangle integrated circuit (e.g. equilateral triangle integrated circuit 350 in FIG. 4A) allows for a higher number of peripheral I/O pads than the use of a square integrated circuit (e.g. square integrated circuit 380 in FIG. 4B) would provide. In order for a square integrated circuit (e.g. square integrated circuit 380 in FIG. 4B) to allow for the same number of peripheral I/O pads as an equilateral triangle integrated circuit (e.g. equilateral triangle integrated circuit 350 in FIG. 4A) would allow, the square integrated circuit would require more surface area, and, therefore, an increased amount of unused silicon.

Figure 5:
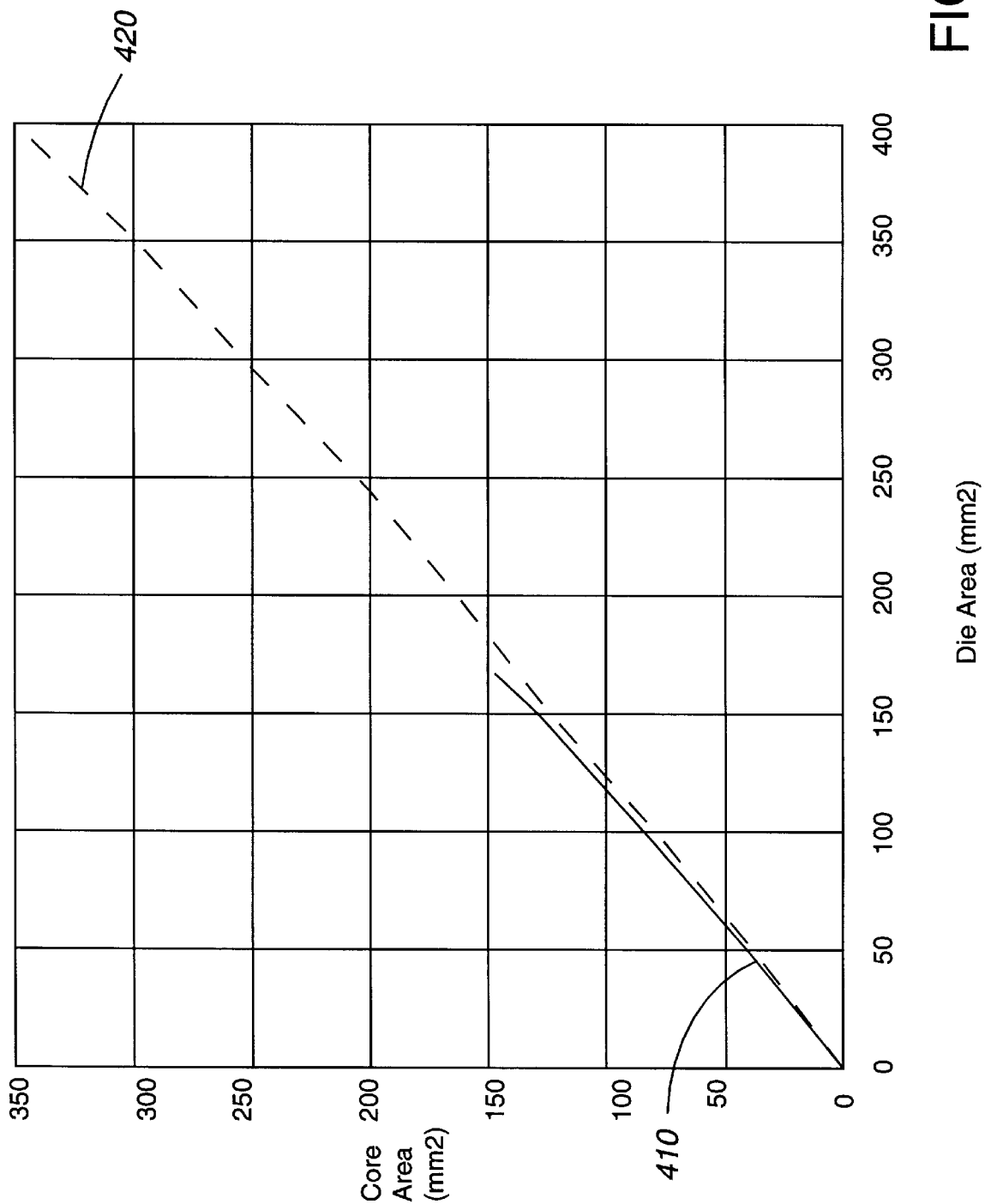
FIG. 5 is a graphical representation of the relationship between the core area and the die area for both rectangularly shaped and triangularly shaped dies.

FIG. 5 is a graphical representation of the relationship between the core area and the die area for both square and equilateral triangle integrated circuit dies. A square core area is employed in the square integrated circuit, while a triangular core area is employed in the triangular integrated circuit. The vertical axis of the graph as shown in FIG. 5 is the useable core area of an integrated circuit die in units of square millimeters, while the horizontal axis is the overall area of an integrated circuit die in units of square millimeters. Line 410 represents the relationship between the die area and the core area for an equilateral triangle circuit die and line 420 represents the relationship between the die area and the core area for a square integrated circuit die. Lines 410 and 420 closely follow each other, and have approximately the same slope. In other words, the core areas for triangular and square dies equivalent areas are nearly equal.

Figure 6:
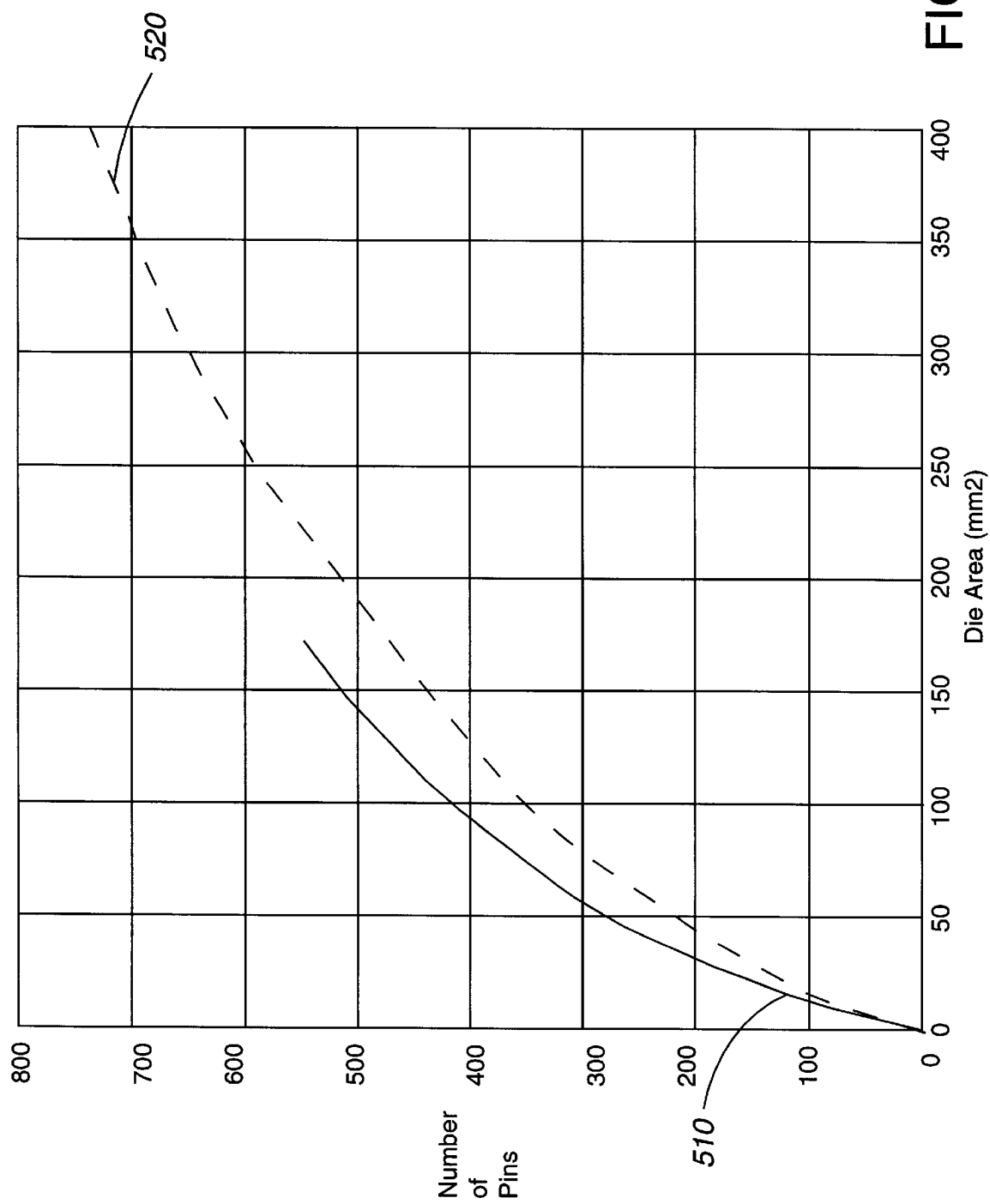
FIG. 6 is a graphical representation of the relationship between the maximum allowable number of peripheral I/O pads and the die area for both rectangularly shaped and triangularly shaped dies. *(for a fixed I/O pad pitch=0.1 mm)

FIG. 6 is a graphical representation of the relationship between the maximum allowable number of peripheral I/O pads and the die area for both square and equilateral triangle dies. The vertical axis of the graph as shown in FIG. 5 is the number of I/O pads, or pins, which may be placed along the periphery integrated circuit die, and the horizontal axis is the overall area of an integrated circuit die in units of square millimeters. Line 510 represents the relationship between the die area and the maximum number of peripheral I/O pads possible for an equilateral triangle integrated circuit die and line 520 represents the relationship between the die area and the maximum number of peripheral I/O pads possible for a square integrated circuit die.

For small die areas, as for example die areas of less than approximately 10 square millimeters, lines 510 and 520 show that the maximum number of I/O pads allowed on the periphery of an integrated circuit is slightly greater for triangularly shaped integrated circuits than it is for squarely shaped integrated circuits. As die areas increase, the maximum number of I/O pads which may be placed along the periphery of both triangularly shaped and squarely shaped integrated circuit dies increases, as suggested by lines 510 and 520, respectively. However, line 510, which represents the relationship between die area and the maximum number of peripheral I/O pins for a triangularly shaped integrated circuit, increases more sharply than line 520, which represents the relationship between die area and the maximum number of peripheral I/O pins for a squarely shaped integrated circuit. Hence, it should be clear that triangularly shaped integrated circuit dies will generally allow for a higher number of peripheral I/O pads for a given die area than squarely shaped integrated circuit dies would allow. When die areas are small, while the number of peripheral I/O pads allowed by triangularly shaped integrated circuit dies is generally still greater than the number allowed by rectangularly shaped integrated circuit pads, the additional number of peripheral I/O pads afforded by triangularly shaped integrated circuit chips is less significant.

Figure 7:
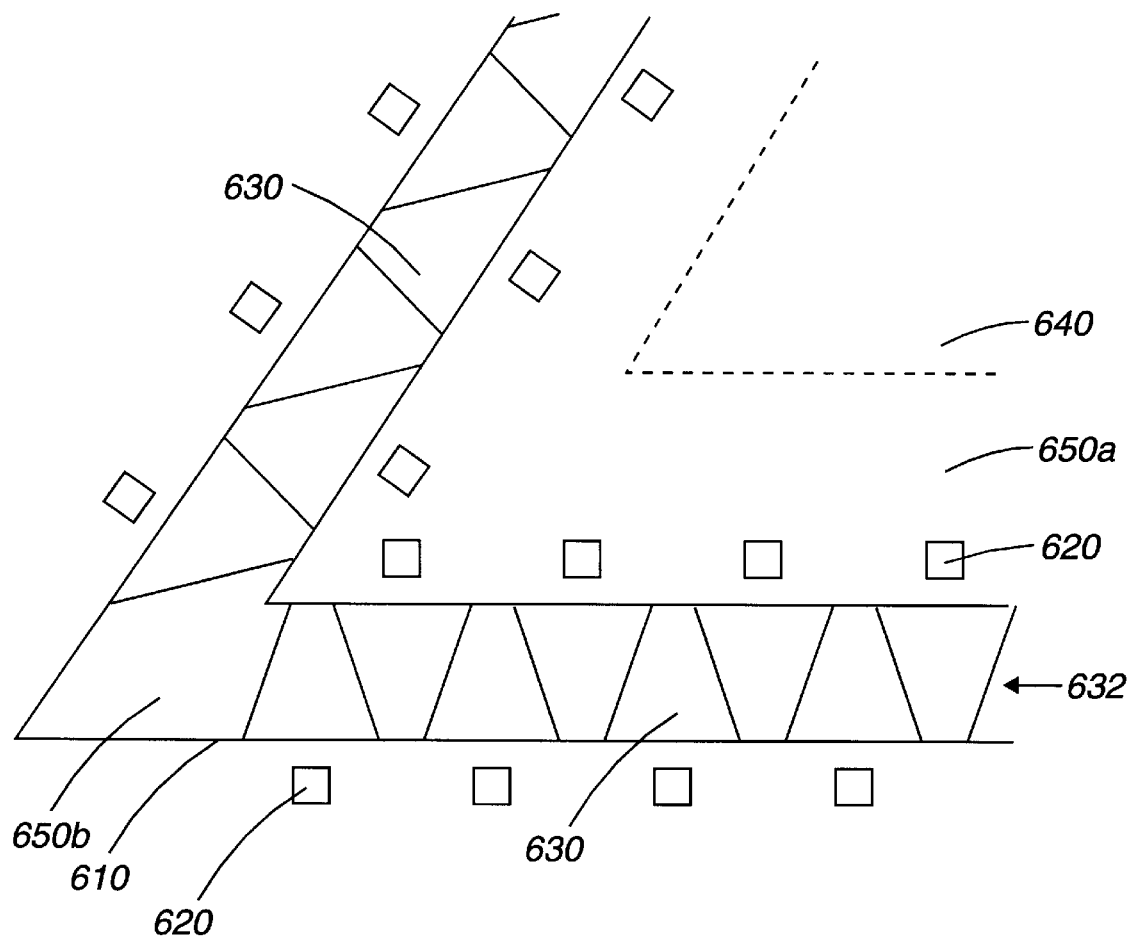
FIG. 7 is a diagrammatic top view of a portion of a triangularly shaped integrated circuit illustrating I/O slots and I/O bonding pads in accordance with a preferred embodiment of the present invention.

Referring next to FIG. 7, there is shown a diagrammatic top view of a portion of a triangularly shaped integrated circuit die 610 which illustrates I/O slots 630 and I/O bonding pads 620 in accordance with a preferred embodiment of the present invention. A portion of a core area 640 is separated from I/O bonding pads 620 on triangularly shaped integrated circuit die 610 by an area of unused silicon 650*a*. An additional area of unused silicon 650*b* may be found at the corner of triangularly shaped integrated circuit die 610 which is shown. Each trapezoidally shaped I/O slot 630 includes a series of transistors (not shown) which may serve as amplifiers, etc. I/O slots 630 form a triangularly shaped I/O region 632 along the periphery of triangularly shaped integrated circuit die 610. The transistors which comprise each I/O slot 630 are aligned such that larger transistors are closer to bonding pads 620. As such, the transistors which comprise each I/O slot 630 lend themselves nicely to being oriented to form a basic trapezoidal shape. It should be appreciated that rather than having trapezoidal shapes, I/O slots 630 may also take on basic triangular shapes, or even conventional rectangular shapes.

A higher density of trapezoidal I/O slots 630 may be placed along the periphery of an integrated circuit die than could be obtained with conventional rectangularly shaped I/O slots for two reasons. First, by virtue of the fact that trapezoidally shaped I/O slots 630 enable I/O bonding pads 620 to alternate between opposite sides of trapezoidal I/O slots 630, as shown, the pitch of I/O bonding pads 620 may further be increased.

Second as previously discussed, the use of a triangularly shaped integrated circuit die, as for example triangularly shaped integrated circuit die 610, reduces the amount of unused silicon between the core area (e.g. core area 640), and the I/O bonding pads (e.g. I/O bonding pads 620). Trapezoidally shaped I/O slots 630 further reduce the areas of unused silicon 650*b* found in the corners of triangularly shaped integrated circuit die 610, as trapezoidally shaped I/O slots extend into areas of unused silicon 650*b* found in corners, thereby reducing the overall amount of unused silicon. The use of conventional rectangularly shaped I/O slots would not serve to eliminate additional amounts of unused silicon 650*b* found in corners of triangularly shaped integrated circuit die 610, by virtue of the fact that rectangularly shaped I/O slots would not extend into the corners of triangularly shaped integrated circuit die 610.

Figure 8:
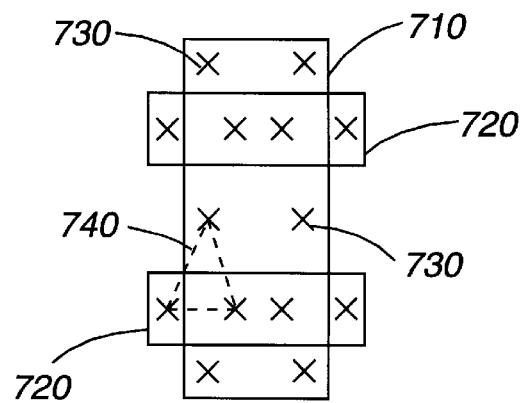
FIG. 8 is a diagrammatic top view of a gate array illustrating routing pads placed such that triangularly shaped transistors may be formed from the gate array in accordance with a preferred embodiment of the present invention.

FIG. 8 is a diagrammatic top view of a two transistor cell 710 having routing connections 730 placed such that triangular routing patterns may be formed on an integrated circuit such as a gate array in accordance with a preferred embodiment of the present invention. Cell 710 is shown as having two gates 720 which are used to form two transistors. Connection grid points 730, otherwise known as routing connections, on cell 710 are oriented on a triangular grid, as shown. As MOS transistors are three terminal devices and therefore have a somewhat triangular shape, the use of triangular grids is a natural choice. Lines 740, which together form a triangle, show how routing lines may be oriented with respect to one another. Triangular routing patterns can be expected to fit well within triangularly shaped core areas as discussed above, thereby facilitating conversion from rectangular designs to triangular designs.

Although only a few preferred embodiments of the present invention have been described, it should be understood that the present invention may be embodied in many other specific forms without departing from the spirit or the scope of the present invention. In particular, although only one alternative geometric shape for a silicon chip die has been disclosed, there are many other geometric shapes for silicon chip dies which would also result in an overall reduction in the amount of silicon wasted in the semiconductor fabrication process. By way of example, a hexagonally shaped integrated circuit die would pack onto a semiconductor wafer in such a manner as to significantly reduce the amount of unused silicon along the perimeter of the wafer. However, the difficulties associated with dicing a wafer containing hexagonally shaped integrated circuit dies to form individual integrated circuits may offset the cost savings achieved by reducing the amount of unused silicon on the wafer. At any rate, there are many other geometric shapes for integrated circuit dies which would reduce the amount of unused silicon either on an individual integrated circuit chip die or on a semiconductor wafer.

While only rectangularly shaped and triangularly shaped core areas have been described, it should be appreciated that the core area of a triangularly shaped integrated circuit die is not limited to the described shapes, and may in fact take on many other shapes. By way of example, the core area may be an irregularly shaped polygon whose shape is governed by the location of logic gates contained within the core area.

Existing techniques intended to increase the available number of I/O pads while reducing die size may be applied to triangularly shaped integrated circuit dies in order to further increase the available number of I/O pads. By way of example, although the costs associated with fabricating integrated circuit dies with pad area arrays are high, using pad area arrays, which involve the distribution of I/O pads across the area of an integrated circuit die, on triangularly shaped integrated circuit dies in conjunction with peripheral I/O pads to further increase the available number of I/O pads does not represent a departure from the spirit or the scope of the present invention. Therefore, the above-described embodiments are to be considered as illustrative and not restrictive, and the invention is not to be limited to the details described herein, but may be modified within the scope of the appended claims.

I claim:

1. A method of producing an integrated circuit, the method comprising the following:

providing a triangularly shaped I/O region on the periphery of said integrated circuit;

providing a core region within said triangularly shaped I/O region, wherein providing a core region within said triangularly shaped I/O region includes providing a rectangularly shaped core region; and providing said triangularly shaped I/O region with I/O slots having trapezoidal shapes.

2. A method of producing an integrated circuit, the method comprising the following steps:

providing a triangularly shaped I/O region on the periphery of said integrated circuit;

providing a core region within said triangularly shaped I/O region;

providing said triangularly shaped I/O region with I/O slots having trapezoidal shapes; and providing a first area within said triangularly shaped I/O region, the first area being located between the core region and the trapezoidally shaped I/O slots, wherein the first area is arranged to separate the core region and the trapezoidally shaped I/O slots.

3. An integrated circuit comprising:

a core region;

a triangularly shaped I/O region surrounding said core region, said triangularly shaped I/O region having a plurality of I/O slots having trapezoidal shapes, wherein a first I/O slot selected from the plurality of I/O slots has a first side and a second side, the first side of the first I/O slot being substantially parallel to the second side of the first I/O slot, and wherein a second I/O slot selected from the plurality of I/O slots has a first side and a second side, the first side of the second I/O slot being substantially parallel to the second side of the second I/O slot and substantially opposite of the first side of the first I/O slot; and a plurality of I/O bonding pads within said triangularly shaped I/O region, wherein a first I/O bonding pad selected from the plurality of I/O bonding pads is positioned substantially adjacent to the second side of the first I/O slot and a second I/O bonding pad selected from the plurality of I/O bonding pads is positioned substantially adjacent to the second side of the second I/O slot.

4. The apparatus of claim 3 wherein the first side of the first I/O slot has a shorter length than the second side of the first I/O slot and the first side of the second I/O slot has a shorter length than the second side of the second I/O slot.

* * * * *